United States Patent
Tsukihara et al.

(10) Patent No.: US 9,842,967 B2
(45) Date of Patent: Dec. 12, 2017

(54) NITRIDE SEMICONDUCTOR LIGHT EMITTING ELEMENT

(71) Applicant: USHIO DENKI KABUSHIKI KAISHA, Tokyo (JP)

(72) Inventors: Masashi Tsukihara, Himeji (JP); Kohei Miyoshi, Himeji (JP); Toru Sugiyama, Himeji (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/318,100

(22) PCT Filed: Jun. 13, 2014

(86) PCT No.: PCT/JP2014/065792
§ 371 (c)(1),
(2) Date: Dec. 12, 2016

(87) PCT Pub. No.: WO2015/190000
PCT Pub. Date: Dec. 17, 2015

(65) Prior Publication Data
US 2017/0117441 A1    Apr. 27, 2017

(51) Int. Cl.
*H01L 33/32* (2010.01)
*H01L 33/02* (2010.01)

(52) U.S. Cl.
CPC ............ *H01L 33/32* (2013.01); *H01L 33/025* (2013.01)

(58) Field of Classification Search
CPC .............................. H01L 33/32; H01L 33/025
See application file for complete search history.

(56) References Cited

U.S. PATENT DOCUMENTS

2010/0055819 A1* 3/2010 Ohba .................. H01L 33/0079
                                                                    438/47
2010/0163931 A1   7/2010 Fujioka et al.

FOREIGN PATENT DOCUMENTS

| JP | 2005-101536 A | 4/2005 |
| JP | 2006-186257 A | 7/2006 |
| JP | 2008-266113 A | 11/2008 |
| NO | 2007/013257 A1 | 2/2007 |

OTHER PUBLICATIONS

Mizuki et al.; 31a-L-35 Nuclear reaction analysis of Carbon doped GaN: A relation between the interstitial carbon and yellow luminescence; The Japan Society of Applied Physics and Related Societies; 52nd Spring Meeting Proceedings; Spring 2005; Saitama University, Japan.

(Continued)

*Primary Examiner* — Tucker J Wright
(74) *Attorney, Agent, or Firm* — Studebaker & Brackett PC

(57) ABSTRACT

Provided is a nitride semiconductor light emitting element in which deep-level light emission is suppressed, monochromaticity is improved, and light is emitted in a high-efficiency manner. A nitride semiconductor light emitting element having a light-emitting layer between an n-type nitride semiconductor layer and a p-type nitride semiconductor layer, wherein the n-type nitride semiconductor layer contains $Al_nGa_{1-n}N$ ($0<n\leq1$), and has a C concentration of $1\times10^{17}/cm^3$ or less.

1 Claim, 5 Drawing Sheets

(56) References Cited

OTHER PUBLICATIONS

International Search Report issued in PCT/JP2014/065792; dated Sep. 9, 2014.
Smith et al.; 341 nm emission from hydride vapor-phase epitaxy ultraviolet light-emitting diodes; Journal of Applied Physics; Jun., 2004; pp. 8247-8251; vol. 95-No. 12.
An Office Action; "Notice of Reasons for Rejection," issued by the Japanese Patent Office dated May 6, 2016, which corresponds to Japanese Patent Application No. 2013-025834.
An Office Action; "Notice of Reasons for Rejection," issued by the Japanese Patent Office dated Oct. 7, 2016, which corresponds to Japanese Patent Application No. 2013-025834.
Notification of Transmittal of Translation of the International Preliminary Report on Patentability and Translation of Written Opinion of the International Searching Authority; PCT/JP2014/065792 dated Dec. 22, 2016.

* cited by examiner

Example 1

Example 2

Comparative example 1

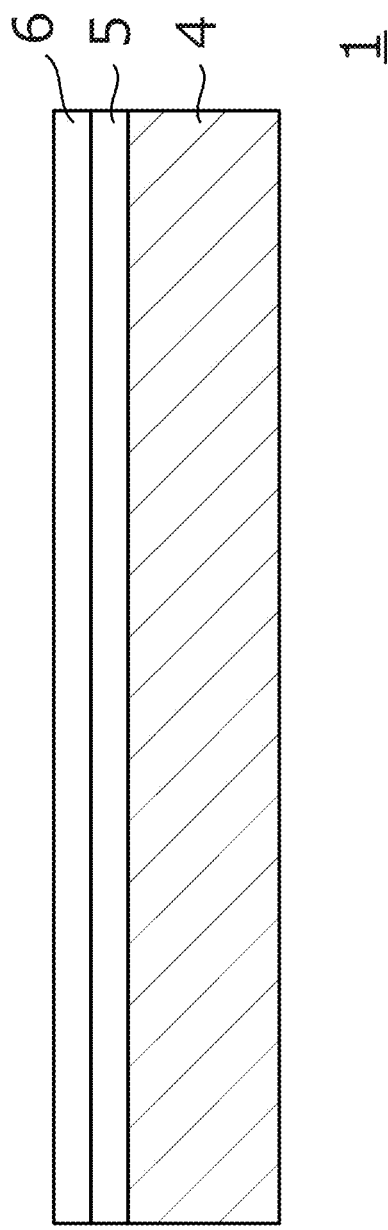

NITRIDE SEMICONDUCTOR LIGHT EMITTING ELEMENT

TECHNICAL FIELD

The present invention relates to a nitride semiconductor light emitting element, and more particularly to a light emitting element with improved light emitting efficiency.

BACKGROUND ART

Conventionally, light emitting elements using nitride semiconductor are widely used for blue light emitting diodes and the like. Recently, ultraviolet light emitting diodes (LED) having an emission wavelength in a shorter wavelength region, for example, at a 370 nm band region are under development.

However, when an ultraviolet light emitting device having an emission wavelength of less than or equal to 375 nm is produced, emission of the yellow visible light band (so called "deep emission") is observed, and the phenomenon that the emission color of the device turns strongly whitish arises. This phenomenon leads yellow or white light emission although the light of the ultraviolet region is intended to be radiated, and leads the problem that the monochromaticity of the radiated light cannot be achieved due to the noise by the visible light component by the deep emission. Also, there is a problem that radiation of the light having a wavelength other than the required wavelength causes deterioration in the light emitting efficiency itself. The deep emission appears significantly in a light emitting device that emits short wavelength light of the ultraviolet region or the like.

While it has been thought that the deep emission is caused by emission in a defect or in an impurity level in the light emitting layer, this thought is still unclear.

In Non-patent Document 1, some influence by C (carbon) on the deep emission is discussed based on the measurement of photoluminescence.

PRIOR ART DOCUMENT

Non-Patent Document

Non-patent Document 1: Mizuki et al., "Nuclear reaction analysis of C-doped GaN: Regarding the correlation between interstitial carbon and yellow luminescence", March 2005, proceedings 31a-L-35 for the consociation lecture meeting associated with the 52nd conference of the Japan Society of Applied Physics.

SUMMARY OF THE INVENTION

Problems to be Solved by the Invention

The present inventors assumed that the deep emission could be attenuated by improving the quality of the light emitting layer if the emission in a defect or in an impurity level in the light emitting layer is a cause of the deep emission as described above. In other words, the present inventors assumed that the deep emission can be widely attenuated by minimizing the defect and the contained impurity (for example, C) in the light emitting layer.

Based on this assumption, for different ultraviolet LED elements (51 to 55) having a major emission wavelength at a 370 mm band, the same current was applied, and for each element, the relation between the emission output of the major emission wavelength of the element, and the ratio of the deep emission intensity to the light intensity of the major emission wavelength (hereinafter, referred to as "deep intensity ratio") was measured. The measurement result is shown in FIG. 1.

It is assumed that the LED elements 54, 55 showing high light intensity of the major emission wavelength in the condition that the same current is applied, have a light emitting layer of better quality containing less defect or impurities in comparison with the LED elements 51, 52.

Certainly, in the LED elements 52 to 55 assumed as having a light emitting layer having a better quality than that of the LED element 51, the deep intensity ratio decreases. Based on only this point, it is assumed that the deep intensity ratio can be decreased by improving the quality of the light emitting layer. That is, it can be concluded that the emission in a defect or in an impurity level in the light emitting layer is a cause of the deep emission.

Since the emission output of the major emission wavelength increases greatly in the order of the LED elements 51, 52, 53, 54, and 55, it can be realized that the quality of the light emitting layer improves in this order, however, the rate of decrease in the deep intensity ratio is significantly lower than the ratio of improvement in the emission output. In addition, comparing the LED elements 54 and 55, the deep intensity ratio little changes despite the appearance of adequate difference in the emission output.

Based on this experimental result, the present inventors assumed that deep emission is caused by other event different from the emission in a defect or in an impurity level in the light emitting layer, and reached the idea that by investigating the cause, it is possible to decrease the deep intensity ratio.

It is an object of the present invention to provide a nitride semiconductor light emitting element having excellent light emitting efficiency by suppressing the deep emission and increasing the monochromaticity.

Means for Solving the Problem

The present invention is a nitride semiconductor light emitting element having a light emitting layer between an n-type nitride semiconductor layer and a p-type nitride semiconductor layer, and the n-type nitride semiconductor layer contains $Al_nGa_{1-n}N$ ($0 \ll n \leq 1$), and a concentration of C contained in the n-type nitride semiconductor layer is less than or equal to $1 \times 10^{17}/cm^3$.

As will be described later in Examples, through diligent efforts, the present inventors found that increased concentration of C contained in the n-type nitride semiconductor layer leads strong actualization of the deep emission from the light emitting element. Also, the present inventors found that by setting the concentration of C to be less than or equal to $1 \times 10^{17}/cm^3$, the emission output of the deep emission can be significantly reduced, relative to the emission output of the major emission wavelength.

When a light emitting element having a major emission wavelength of ultraviolet light is configured as a nitride semiconductor light emitting element, dark violet light would be normally emitted under the influence of the violet visible light corresponding to the flared part of the peak wavelength by emission of the ultraviolet light. However, when deep emission including light of a yellow visible light band occurs, the emitting light is whitish due to mixture of the violetish light and the yellowish light.

However, when an ultraviolet light emitting element is configured in the same manner while the concentration of C contained in the n-type nitride semiconductor layer is set to be less than or equal to $1 \times 10^{17}/cm^3$ as in the present invention, the whitishness is reduced in the color of the light emitted from the element. As the concentration of C is reduced, the whitishness is lost, and the emission color turns into dark violet. This also reveals that the deep emission can be suppressed by reducing the concentration of C contained in the n-type nitride semiconductor layer. As a result of this, the monochromaticity and the emission efficiency of the light emitting element can be improved.

The problem of deep emission significantly appears in an ultraviolet light emitting element having a major emission wavelength of less than or equal to 375 nm. Therefore, by setting the concentration of C contained in the n-type nitride semiconductor layer to be less than or equal to $1 \times 10^{17}/cm^3$ in the ultraviolet light emitting element, the effect of suppressing the deep emission maximally appears. Since more or less deep emission arises even when the element is not an ultraviolet light emitting element, it is possible to realize the effect of suppressing the deep emission by setting the concentration of C contained in the n-type nitride semiconductor layer to be less than or equal to $1 \times 10^{17}/cm^3$ for a light emitting element of which major emission wavelength exceeds 375 nm in the same manner.

The nitride semiconductor light emitting element may be an ultraviolet light emitting element having a major emission wavelength of less than or equal to 375 nm, and an intensity rate of an emission intensity of a yellow visible light wavelength to an emission intensity of the major emission wavelength may be less than or equal to 0.1%.

As described above, by setting the concentration of C contained in the n-type nitride semiconductor layer to be less than or equal to $1 \times 10^{17}/cm^3$, the intensity ratio of the emission intensity of the yellow visible light wavelength, to the emission intensity of the major emission wavelength is less than or equal to 0.1%, and the deep emission is suppressed to a non-problematic level.

Effect of the Invention

According to the nitride semiconductor light emitting element of the present invention, since the deep emission is suppressed, a light emitting element having high monochromaticity and high light emitting efficiency is realized.

BRIEF DESCRIPTION OF THE DRAWINGS

FIG. 5 is another schematic section view showing the nitride semiconductor light emitting element.

MODE FOR CARRYING OUT THE INVENTION

Figure 1:
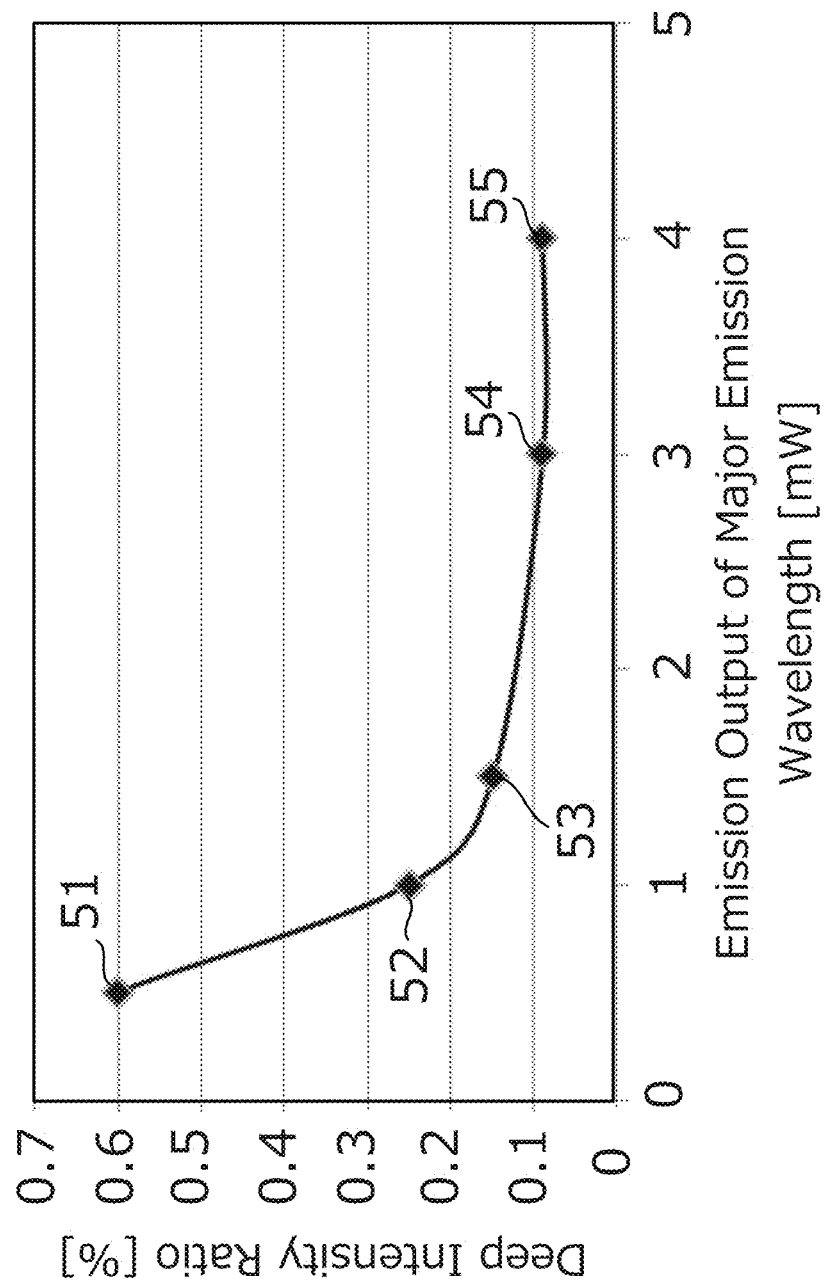
FIG. 1 is a graph showing the relation between the emission output of the major emission wavelength and the ratio of the deep emission intensity to the light intensity of the major emission wavelength of each element when the same current is applied to different ultraviolet LED elements.

A nitride semiconductor light emitting element according to the present invention will be described with reference to the drawings. In each of the drawings, the dimension ratio in the drawings does not necessarily coincide with the actual dimension ratio.

Structure

Figure 2:
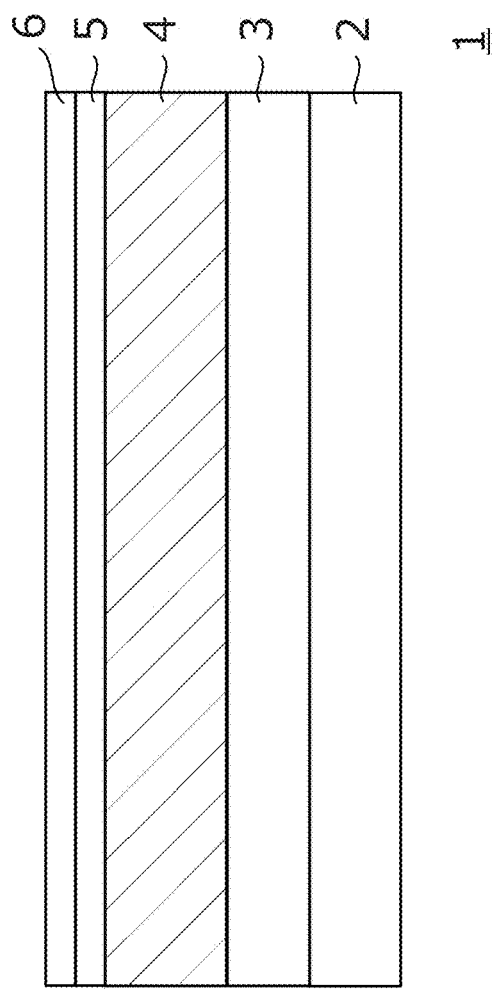
FIG. 2 is a schematic section view of a nitride semiconductor light emitting element.

The structure of a nitride semiconductor light emitting element 1 according to the present invention will be described by referring to FIG. 2. FIG. 2 is a schematic section view of the nitride semiconductor light emitting element 1. Hereinafter, the nitride semiconductor light emitting element 1 is abbreviated as "LED element 1".

In the present embodiment, description will be made for the LED element 1 embodied by an ultraviolet light emitting element having a major emission wavelength of a 370 nm band, however, the emission wavelength is not limited to this value.

The LED element 1 is formed by laminating a support substrate 2, an undoped layer 3, an n-type nitride semiconductor layer 4, a light emitting layer 5, and a p-type nitride semiconductor layer 6 in this order from below.

Support Substrate 2

The support substrate 2 is constituted of a sapphire substrate. Here, instead of sapphire, the support substrate 2 may be constituted of Si, SiC, MN, AlGaN, GaN, YAG, or the like.

Undoped Layer 3

The undoped layer 3 is formed of GaN. More specifically, the undoped layer 3 is formed of a low-temperature buffer layer made of GaN and an underlayer made of GaN on top thereof.

n-Type Nitride Semiconductor Layer 4

The n-type nitride semiconductor layer 4 is constituted of $Al_nGa_{1-n}N$ (0<n≤1) formed so that a concentration of C as impurities are less than or equal to $1 \times 10^{17}/cm^3$. The method for reducing the contained concentration of C will be described later.

Light Emitting Layer 5

The light emitting layer 5 is formed, for example, of a semiconductor layer (AlGaInN light emitting layer) having a multiquantum well structure in which a well layer of GaInN and a barrier layer of AlGaN are periodically repeated. These layers may be undoped, or may be doped into p-type or n-type.

p-Type Nitride Semiconductor Layer 6

The p-type nitride semiconductor layer 6 is constituted of $Al_mGa_{1-m}N$ (0<m≤1). Unlike the n-type nitride semiconductor layer 4, the concentration of C contained as impurities may be larger than $1 \times 10^{17}/cm^3$ in the p-type nitride semiconductor layer 6. Also this point will be described later.

Although not illustrated in FIG. 2, the LED element 1 may have a high concentration p-type GaN layer for contact on top of the p-type nitride semiconductor layer 6. Also an n-electrode may be provided on top of the n-type nitride semiconductor layer 4 exposed by etching, and a p-electrode may be provided on top of the high concentration p-type GaN layer.

Manufacturing Process

Next, the manufacturing process of the LED element 1 shown in FIG. 2 will be described. This manufacturing process is merely one example, and the flow rate of gas, the temperature within the furnace, the pressure within the furnace and the like may be appropriately adjusted.

First, the undoped layer 3 is formed on top of the support substrate 2. This is realized, for example, by the following method.

Preparation of Support Substrate 2

A sapphire substrate is prepared as the support substrate 2, and the c-plane sapphire substrate is cleaned. More specifically, this cleaning is carried out, for example, by placing the c-plane sapphire substrate in a processing furnace of an MOCVD (Metal Organic Chemical Vapor Deposition: organic metal chemical gas-phase vapor deposition) apparatus and raising the temperature within the furnace to be, for example, 1150° C. while allowing a hydrogen gas to flow at a flow rate of 10 slm in the processing furnace.

Forming Undoped Layer 3

Next, a low-temperature buffer layer made of GaN is formed on the surface of c-plane sapphire substrate, and further an underlayer made of GaN is formed on top thereof. The low-temperature buffer layer and the underlayer correspond to the undoped layer 3.

A more specific method of forming the undoped layer 3 is, for example, as follows. First, the pressure within the furnace of the MOCVD apparatus is set to be 100 kPa, and the temperature within the furnace is set to be 480° C. Then, trimethylgallium (TMG) having a flow rate of 50 μmol/min and ammonia having a flow rate of 223000 μmol/min are supplied as source material gases for 68 seconds into the processing furnace while allowing a nitrogen gas and a hydrogen gas each having a flow rate of 5 slm to flow as carrier gases in the processing furnace. By this process, the low-temperature buffer layer made of GaN and having a thickness of 20 nm is formed on the surface of c-plane sapphire substrate.

Next, the temperature within the furnace of the MOCVD apparatus is raised to 1150° C. Then, TMG having a flow rate of 100 μmol/min and ammonia having a flow rate of 223000 μmol/min are supplied as source material gases for 30 minutes into the processing furnace while allowing a nitrogen gas having a flow rate of 20 slm and a hydrogen gas having a flow rate of 15 slm to flow as carrier gases in the processing furnace. By this process, the underlayer made of GaN and having a thickness of 3 μm is formed on the surface of the low-temperature buffer layer.

Formation of n-Type Nitride Semiconductor Layer 4

Next, the n-type nitride semiconductor layer 4 having a composition of $Al_nGa_{1-n}N$ ($0<n\leq 1$) is formed on top of the undoped layer 3.

A more concrete method for forming the n-type nitride semiconductor layer 4 is, for example, as follows. First, in the condition that the temperature within the furnace is kept at 1150° C., the pressure within the furnace of the MOCVD apparatus is set to be 30 kPa. Then while a nitrogen gas having a flow rate of 20 slm and a hydrogen gas having a flow rate of 15 slm are flown as carrier gases in the processing furnace, TMG, trimethylaluminum (TMA), ammonia and tetraethylsilane for doping with an n-type impurity are supplied as source material gases into the processing furnace for 30 minutes. As a result, the n-type nitride semiconductor layer 4 having a composition of, for example, $Al_{0.06}Ga_{0.94}N$ and a thickness of 1.7 μm is formed on top of the undoped layer 3.

By setting the flow rate ratio between ammonia which is Group V, and TMG and TMA which are Group III (V/III ratio) to be larger than or equal to 2000, it is possible to set the concentration of C contained in the n-type nitride semiconductor layer 4 to be less than or equal to $1\times 10^{17}/cm^3$. For example, by using ammonia having a flow rate of 223000 μmol/min, TMG having a flow rate of 100 μmol/min, and TMA having a flow rate of 7 μmol/min as source materials, the V/III ratio can be set to be about 2000. Although tetraethylsilane also contains C atoms, the flow rate thereof is, for example, about 0.025 μmol/min, and thus the influence on the concentration of C contained in the n-type nitride semiconductor layer 4 is neglectable in comparison with TMG and TMA.

When the V/III ratio was 1000, the concentration of C contained in the generated n-type nitride semiconductor layer 4 was $5\times 10^{17}/cm^3$ (later-described Comparative example 1). When the V/III ratio was 2000, the concentration of C was $1\times 10^{17}/cm^3$ (later-described Example 2). When the V/III ratio was 4000, the concentration of C was $5\times 10^{16}/cm^3$ (later-described Example 1). The concentration of C contained in the generated n-type nitride semiconductor layer 4 was measured by SIMS (secondary ion mass spectrometry).

TMG and TMA which are source material gases contain a C atom as a constituting molecule. Meanwhile, ammonia does not contain a C atom. Therefore, by increasing the V/III ratio, it is possible to reduce the concentration of C contained in the formed n-type nitride semiconductor layer 4.

It is also possible to reduce the concentration of C contained in the n-type nitride semiconductor layer 4 by increasing the growth pressure besides increasing the V/III ratio. This would be because the same effect as obtained by increasing the V/III ratio can be obtained as a result of formation of an ammonia rich environment in the furnace due to extension of the time during which ammonia resides in the MOCVD apparatus by increasing the growth pressure. In this case, the growth pressure is preferably greater than or equal to 30 kPa and less than or equal to 100 kPa, and more preferably greater than or equal to 50 kPa and less than or equal to 100 kPa.

Here, silicon (Si), germanium (Ge), sulfur (S), selenium (Se), tin (Sn), tellurium (Te), and others may be used as the n-type impurity contained in the n-type nitride semiconductor layer 4. Among these, silicon (Si) is especially preferable.

Formation of Light Emitting Layer 5

Next, the light emitting layer 5 having a multiquantum well structure constituted of AlGaInN is formed on top of the n-type nitride semiconductor layer 4.

Concretely, first, the pressure within the furnace of the MOCVD apparatus is set to be 100 kPa, and the temperature within the furnace is set to be 830° C. Then the step of supplying the interior of the processing furnace with TMG having a flow rate of 10 μmol/min, trimethylindium (TMI) having a flow rate of 12 μmol/min and ammonia having a flow rate of 300000 μmol/min as source material gases for 48 seconds while flowing a nitrogen gas having a flow rate of 15 slm and a hydrogen gas having a flow rate of 1 slm as carrier gases in the processing furnace is conducted. Then the step of supplying the interior of the processing furnace with TMG having a flow rate of 10 μmol/min, TMA having a flow rate of 1.6 μmol/min, tetraethylsilane having a flow rate of 0.002 μmol/min, and ammonia having a flow rate of 300000 μmol/min as source material gases for 120 seconds is conducted. Thereafter, by repeating these steps, the light emitting layer 5 in which a light-emitting layer constituted of GaInN and having a thickness of 2 nm, and a barrier layer constituted of n-type AlGaN and having a thickness of 7 nm are repeated 15 cycles is formed on the surface of the n-type nitride semiconductor layer 4.

Formation of p-Type Nitride Semiconductor Layer 6

Next, the p-type nitride semiconductor layer 6 constituted of $Al_mGa_{1-m}N$ ($0 \leq m < 1$) is formed on top of the light emitting layer 5.

Concretely, the pressure within the furnace of the MOCVD apparatus is maintained to be 100 kPa, and the temperature within the furnace is raised to 1025° C. while a nitrogen gas having a flow rate of 15 slm and a hydrogen gas having a flow rate of 25 slm are allowed to flow as carrier gases in the processing furnace. Thereafter, TMG having a flow rate of 35 μmol/min, TMA having a flow rate of 20 μmol/min, ammonia having a flow rate of 250000 μmol/min, and bicyclopentadienyl magnesium ($Cp_2Mg$) having a flow rate of 0.1 μmol/min for doping with a p-type impurity are supplied as source material gases into the processing furnace for 60 seconds. By this process, a hole supply layer having a composition of $Al_{0.3}Ga_{0.7}N$ and having a thickness of 20 nm is formed on the surface of the light emitting layer 5. Thereafter, by changing the flow rate of TMG to 9 μmol/min and supplying the source material gases for 360 seconds, a hole supply layer having a composition of $Al_{0.13}Ga_{0.87}N$ and having a thickness of 120 nm is formed. These hole supply layers constitute the p-type nitride semiconductor layer 6.

Here, in the process of forming the p-type nitride semiconductor layer 6, since the film is grown at a temperature lower than that in the process of forming the n-type nitride semiconductor layer 4, the interior of the furnace has an Group III-rich environment compared with that at the time of forming the n-type nitride semiconductor layer 4. Therefore, the concentration of C contained in the p-type nitride semiconductor layer 6 can be higher than that of the n-type nitride semiconductor layer 4. However, as will be described later, even when the concentration of C contained in the p-type nitride semiconductor layer 6 was as high as about $1 \times 10^{19}/cm^3$, for example, it was possible to obtain the effect of attenuating the deep emission by setting the concentration of C contained in the n-type nitride semiconductor layer 4 to be less than or equal to $1 \times 10^{17}/cm^3$.

As the p-type impurity, magnesium (Mg), beryllium (Be), zinc (Zn), carbon (C) or the like can be used.

Subsequent Step

After formation of the p-type nitride semiconductor layer 6, supply of the TMA is stopped, and the flow rate of bicyclopentadienyl magnesium ($Cp_2Mg$) is changed to 0.2 μmol/min and the source material gas is supplied for 20 seconds. By this process, a high concentration p-type GaN layer constituted of p-type GaN and having a thickness of 5 nm is formed.

Then after conducting an annealing process, the upper face of a part of the n-type nitride semiconductor layer 4 is exposed by etching. Then on the upper face of the exposed n-type nitride semiconductor layer 4, an n-electrode is formed, and on the upper face of the high concentration p-type GaN layer, a p-electrode is formed.

EXAMPLES

Hereinafter, the present invention will be described by referring to examples.

Three elements of Example 1, Example 2, and Comparative example 1 were formed in the same conditions except that only the V/III ratio of the source material gas at the time of forming the n-type nitride semiconductor layer 4 was changed in the aforementioned process. Every element is an ultraviolet light emitting element having a major emission wavelength of 370 nm.

Example 1

The element was formed while the V/III ratio was set to be 4000. The concentration of C contained in the n-type nitride semiconductor layer 4 was $5 \times 10^{16}/cm^3$.

Example 2

The element was formed while the V/III ratio was set to be 2000. The concentration of C contained in the n-type nitride semiconductor layer 4 was $1 \times 10^{17}/cm^3$.

Comparative Example 1

The element was formed while the V/III ratio was set to be 1000. The concentration of C contained in the n-type nitride semiconductor layer 4 was $5 \times 10^{17}/cm^3$.

In every element, the V/III ratio of the source material gas at the time of forming the p-type nitride semiconductor layer 6 was 6000, and the concentration of C contained in the p-type nitride semiconductor layer 6 was $1 \times 10^{17}/cm^3$.

Figure 3:
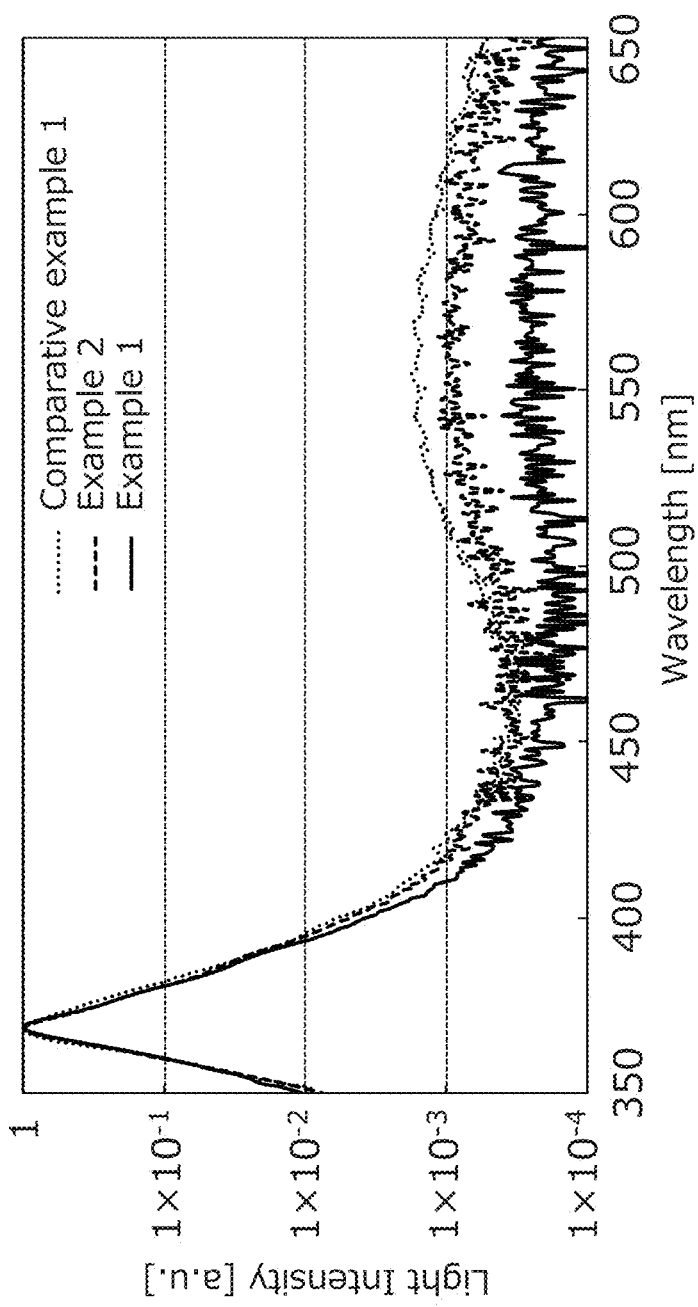
FIG. 3 is a graph showing spectrum distribution of light when the same current is applied to three elements of Example 1, Example 2, and Comparative example 1.
Figure 4:
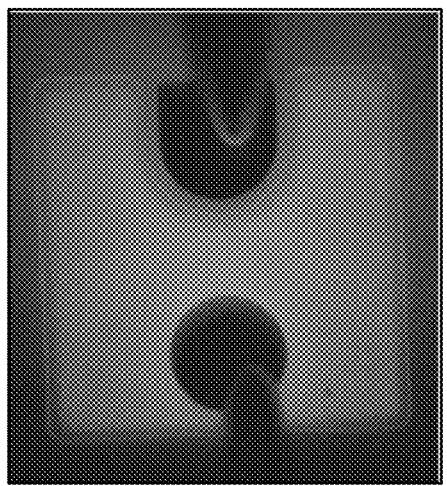
FIG. 4 is a photo showing the light emitting mode when the same current is applied to three elements of Example 1, Example 2, and Comparative example 1.
Figure 4:
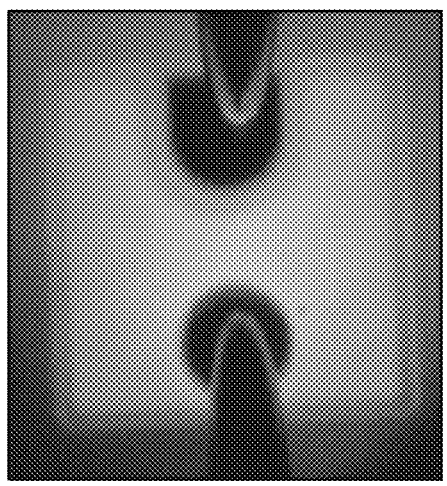
Figure 4:
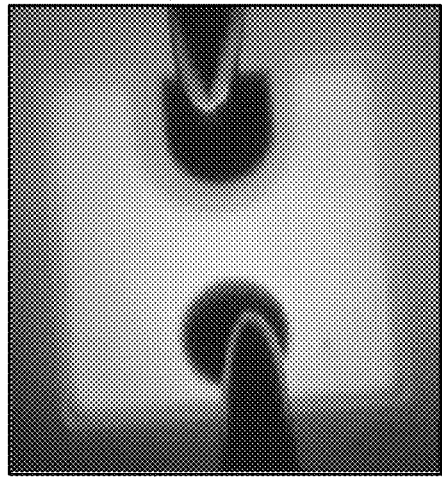

FIG. 3 is a graph showing spectrum distributions of light obtained when the same voltage is applied to the three elements of Example 1, Example 2, and Comparative example 1. The horizontal axis represents an emission wavelength, and the vertical axis represents a light intensity. FIG. 4 shows photographs showing the light emitting condition of each element.

As shown in FIG. 3, in Comparative example 1, the ratio (deep intensity ratio) of the intensity of the emission wavelength of the band of 550 nm to 600 nm including the yellow visible light wavelength range (deep emission), to the emission intensity of 370 nm band is about 0.3%, which exceeds 0.1%. In this case, while dark violet light would be emitted under the influence of the violet visible light corresponding to the flared part of the peak wavelength by emission of the ultraviolet light under normal circumstances, considerably whitish lighting is observed under the influence of the deep emission as can be seen in FIG. 4. As a result of mixture of the violetish light and the yellowish light, the emitting light is whitish. According to FIG. 3, the deep intensity ratio of Example 1 is about 0.03%, and the deep intensity ratio of Example 2 is about 0.1%.

In contrast to this, in Example 1 and Example 2, the deep intensity ratio is suppressed to less than or equal to 0.1%, and also in the photographs of FIG. 4, the whitishness is reduced in the color of the light emitted from the elements, and dark color is observed. Comparison among Comparative example 1, Example 1, and Example 2 reveals that the effect of decreasing the deep intensity ratio is obtained as the concentration of C contained in the n-type nitride semiconductor layer 4 is reduced.

Also the measurement was conducted in the same manner as in Example 2 by setting the V/III ratio of the source material gas at the time of forming the p-type nitride semiconductor layer 6 to be 1000, and raising the concentration of C contained in the p-type nitride semiconductor layer 6 to $1\times10^{19}/cm^3$ in the condition that the concentration of C contained in the n-type nitride semiconductor layer 4 was $1\times10^{17}/cm^3$, however, no significant difference from Example 2 was observed. This also indicates that the concentration of C contained in the n-type nitride semiconductor layer 4 influences on the deep emission.

That is, it can be found that the deep emission is derived from the impurity level produced by C contained in the n-type nitride semiconductor layer 4 rather than in the light emitting layer 5. Therefore, it is possible to suppress the deep emission by making the concentration of C contained in the n-type nitride semiconductor layer 4 as small as possible.

When Mg is doped as an impurity of the p-type nitride semiconductor layer 6, it is expected that emission derived from the level at C is suppressed by the level produced by Mg. Therefore, the impurity concentration of C contained in the p-type nitride semiconductor layer 6 would not influence on the deep emission at least if it is less than or equal to the doping amount of Mg. Since the doping concentration of Mg is about 1 to $2\times10^{19}/cm^3$, a concentration of C contained in the p-type nitride semiconductor layer 6 around $1\times10^{19}/cm^3$ does not influence on the deep emission. However, when the n-type nitride semiconductor layer 4 contains C in a comparable concentration of C, high deep emission occurs as is already described.

Since the light emitting layer 5 is also constituted of an n-polar nitride semiconductor, a lower concentration of C contained in the light emitting layer 5 is preferred. However, since the light emitting layer 5 has a very small thickness compared with the n-type nitride semiconductor layer 4, the absolute amount of C contained therein is very small compared with the n-type nitride semiconductor layer 4. Therefore, actually, contribution to the deep emission is not as large as the concentration of C contained in the n-type nitride semiconductor layer 4.

ANOTHER EMBODIMENT

In the above description, the LED element 1 shown in FIG. 2 has the support substrate 2 and the undoped layer 3; however, the configuration in which these are peeled off (see FIG. 5) may be employed. Also in this case, the effects similar to those described above by referring to FIGS. 3 to 4 were obtained.

DESCRIPTION OF REFERENCE SIGNS

1: nitride semiconductor light emitting element
2: support substrate
3: undoped layer
4: n-type nitride semiconductor layer
5: light emitting layer
6: p-type nitride semiconductor layer
51, 52, 53, 54, 55: LED element(s)

The invention claimed is:

1. A nitride semiconductor light emitting element having a light emitting layer between an n-type nitride semiconductor layer and a p-type nitride semiconductor layer, wherein the n-type nitride semiconductor layer contains $Al_nGa_{1-n}N$ ($0<n\leq1$), and a concentration of C contained in the n-type nitride semiconductor layer is less than or equal to $1\times10^{17}/cm^3$; and an intensity rate of an emission intensity of a yellow visible light wavelength to an emission intensity of the major emission wavelength is less than or equal to 0.1%.

* * * * *